United States Patent
Lee et al.

(10) Patent No.: US 8,669,180 B1
(45) Date of Patent: Mar. 11, 2014

(54) SEMICONDUCTOR DEVICE WITH SELF ALIGNED END-TO-END CONDUCTIVE LINE STRUCTURE AND METHOD OF FORMING THE SAME

(71) Applicant: Taiwan Semiconductor Manufacturing Co., Ltd., Hsin-Chu (TW)

(72) Inventors: Chia-Ying Lee, New Taipei (TW); Jyu-Horng Shieh, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/684,709

(22) Filed: Nov. 26, 2012

(51) Int. Cl.
*H01L 21/44* (2006.01)

(52) U.S. Cl.
USPC ........... 438/672; 438/618; 438/633; 438/637; 438/639; 438/666; 257/E21.088

(58) Field of Classification Search
None
See application file for complete search history.

(56) References Cited

U.S. PATENT DOCUMENTS

2005/0277249 A1\* 12/2005 Juengling ............ 438/257
2011/0124134 A1   5/2011 Lin et al.

\* cited by examiner

*Primary Examiner* — Kyoung Lee
(74) *Attorney, Agent, or Firm* — Duane Morris LLP

(57) ABSTRACT

A method for forming semiconductor devices using damascene techniques provides self-aligned conductive lines that have an end-to-end spacing less than 60 nm without shorting. The method includes using at least one sacrificial hardmask layer to produce a mandrel and forming a void in the mandrel. The sacrificial hardmask layers are formed over a base material which is advantageously an insulating material. Another hardmask layer is also disposed over the base material and under the mandrel in some embodiments. Spacer material is formed alongside the mandrel and filling the void. The spacer material serves as a mask and at least one etching procedure is carried out to translate the pattern of the spacer material into the base material. The patterned base material includes trenches and raised portions. Conductive features are formed in the trenches using damascene techniques.

20 Claims, 5 Drawing Sheets

SEMICONDUCTOR DEVICE WITH SELF ALIGNED END-TO-END CONDUCTIVE LINE STRUCTURE AND METHOD OF FORMING THE SAME

TECHNICAL FIELD

The disclosure relates to semiconductor devices and methods for forming the same using damascene techniques and sacrificial hardmask layers.

BACKGROUND

In today's rapidly advancing semiconductor manufacturing industry, there is a continued drive to produce feature sizes of smaller and smaller dimensions. Conductive lines are most critical to any integrated circuit or other semiconductor device as they interconnect the active devices and carry current and signals that enable the semiconductor device to operate. The drive to continue to decrease feature size applies to conductive lines. As levels of integration continue to increase, it becomes even more advantageous to form increasingly smaller conductive lines, and to form conductive lines in close proximity to one another and without shorting to one another. This applies to conductive lines, also referred to as leads, that are adjacent one another and also to conductive lines that are aligned end-to-end, i.e. longitudinally.

Damascene techniques and other patterning techniques are available to define conductive lines and other features and various processes are available to form the actual conductive lines. All of these techniques have limitations with respect to the minimum dimensions of the conductive features that can be achieved. There are also limitations with respect to minimum spacing differences between adjacent conductive features that can be achieved without shorting.

The present disclosure provides an advancement that enables the definition and formation of increasingly smaller conductive lines and increasingly tighter spaced conductive features.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

FIGS. 1A and 1B through FIGS. 8A and 8B represent a sequence of processing operations according to one embodiment of the disclosure. Each set of figures (e.g.

DETAILED DESCRIPTION

The disclosure provides various embodiments of processing operations and sequences of processing operations. The processing operations are used to form a patterned base material that includes trenches within which a conductive pattern may be formed. In some embodiments, the sequence of processing operations are used to form conductive lines. In some embodiments, the conductive lines are self aligned, end-to-end and are tightly spaced. In one embodiment, the conductive lines are self aligned, end-to-end and are spaced apart by less than 60 nanometers. The processing operations of the disclosure utilize one or more sacrificial hardmask layers in some embodiments. A line is formed from the sacrificial hardmask layer or layers and a cut or void is formed in the line. After a sequence of processing operations are carried out, damascene processing techniques are used to form conductive lines and in one embodiment the conductive lines are self aligned end-to-end and spaced apart by a dielectric material including a dielectric plug formed by utilizing the void formed in the line of sacrificial hardmask layer or layers.

Figure 1B:
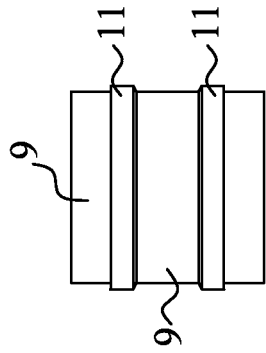
Figure 1A:
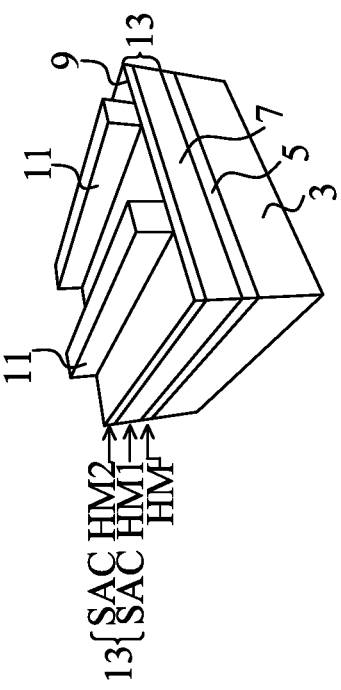

Now turning to the figures, FIGS. 1A and 1B provide a perspective and a top, plan view, respectively, of a stage in the sequence of processing operations according to the disclosure. FIG. 1A includes base material 3 with hardmask layer 5 over base material 3. Sacrificial hardmask material 13 is disposed over hardmask layer 5 and sacrificial hardmask material 13 includes two sacrificial hardmask layers: first sacrificial hardmask layer 7 and second sacrificial hardmask layer 9, in the illustrated embodiment. In other embodiments, sacrificial hardmask material 13 includes additional sacrificial hardmask layers or only one sacrificial hardmask layer. First sacrificial hardmask layer 7 is disposed over hardmask layer 5 and second sacrificial hardmask layer 9 is disposed over first sacrificial hardmask layer 7 in the illustrated embodiment.

Base material 3 represents a semiconductor or other substrate in one embodiment and in another embodiment, base material 3 represents a layer or composite layer of materials formed over a suitable substrate material such as silicon or other materials used in the semiconductor manufacturing industry, in other embodiments. According to one embodiment, base material 3 is an insulating layer such as an oxide layer. In some embodiments, base material 3 is a low-k ("LK") dielectric material, an extreme low-k ("ELK") dielectric material, an ultra LK ("ULK") dielectric material, an interlevel dielectric material, phosphosilicate glass ("PSG"), undoped silicate glass ("USG") or other dielectric materials or silicon. Various methods such as chemical vapor deposition ("CVD"), or plasma enhanced chemical vapor deposition ("PECVD") or other suitable deposition methods are used to form base material 3 in some embodiments but other suitable formation techniques are used in other embodiments.

Hardmask layer 5 is formed of various suitable hardmask materials in various embodiments. In some embodiments, hardmask layer 5 is formed of Ti, TiN, Ta, TaN or TiO but other suitable hardmask materials are used in other embodiments. Hardmask layer 5 is formed using CVD or physical vapor deposition ("PVD") or other suitable deposition or other formation techniques in other embodiments. First sacrificial hardmask layer 7 and second sacrificial hardmask layer 9 are formed of different suitable materials in various embodiments. In one embodiment, first sacrificial hardmask layer is formed using spin coating, CVD or PECVD operations and is formed of spin-on carbon or other advanced patterning films ("APF") such as amorphous carbon but other materials and other formation techniques are used in other embodiments. Second sacrificial hardmask layer 9 is formed used spin coating, CVD or atomic layer deposition ("ALD") or other suitable formation methods in some embodiments. Second sacrificial hardmask layer 9 is formed of SiN, SiON, or a bottom anti-reflective coating ("BARC") such as a BARC with a high silicon content, in some embodiments but other suitable materials are used in other embodiments. Photoresist lines 11 are formed over second sacrificial hardmask layer 9 and are sometimes referred to as mandrels. Various photoresist materials are used in various embodiments.

Figure 2B:
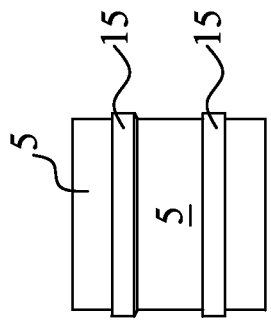
Figure 2A:
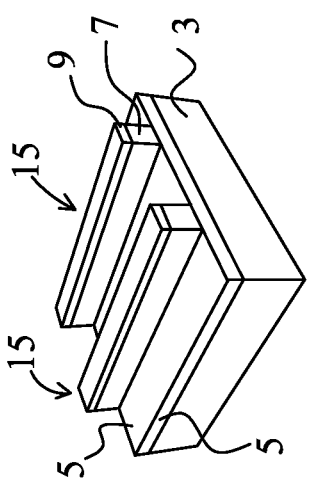

FIGS. 2A and 2B show the structure of FIGS. 1A and 1B after photoresist lines 11 are used as a mask and an etching operation is carried out to etch away exposed portions of first sacrificial hardmask layer 7 and second sacrificial hardmask layer 9 and after the further step of removing the photoresist lines 11. The structure in FIG. 2A shows hardmask layer 5 disposed over base material 3 and sacrificial hardmask lines 15 disposed over hardmask layer 5. Each sacrificial hardmask line 15 includes portions of first sacrificial hardmask layer 7 and second sacrificial hardmask layer 9. Sacrificial hardmask lines 15 are also sometimes referred to as mandrels.

Figure 3B:
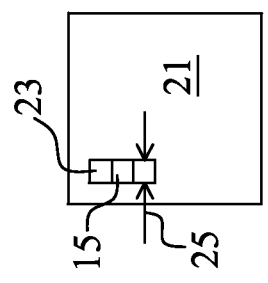
Figure 3A:
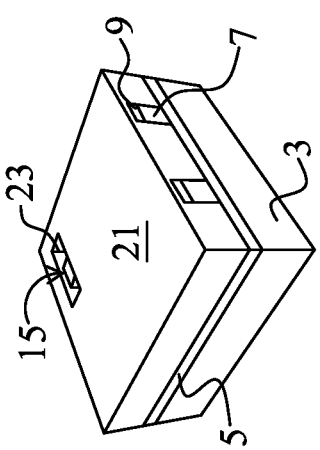

FIGS. 3A and 3B show the structure of FIGS. 2A and 2B after a patterned photoresist layer 21 is formed over the structure in FIGS. 2A, 2B. Patterned photoresist layer 21 includes a substantially planar upper surface and covers the structure including sacrificial hardmask lines 15. Opening 23 is formed in patterned photoresist layer 21 and exposes a portion of sacrificial hardmask line 15. Various photolithographic techniques are used to form opening 23. Smaller dimension 25 of opening 23 is on the order of about 15-60 nm in one embodiment but other dimensions are used in other embodiments. An etching operation is then performed on the structure of FIGS. 3A and 3B to successively etch second sacrificial hardmask layer 9 and first sacrificial hardmask layer 7 that are exposed in opening 23 to form a cut in sacrificial hardmask line 15. After this etching operation is carried out and after patterned photoresist layer 21 is removed, the structures shown in FIGS. 4A, 4B are produced.

Figure 4B:
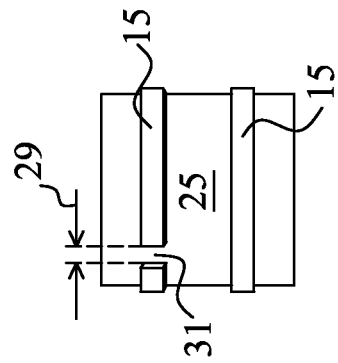
FIGS. 4A, 4B) includes the A suffix figure showing a perspective view and the B suffix figure showing a top, plan view.
Figure 4A:
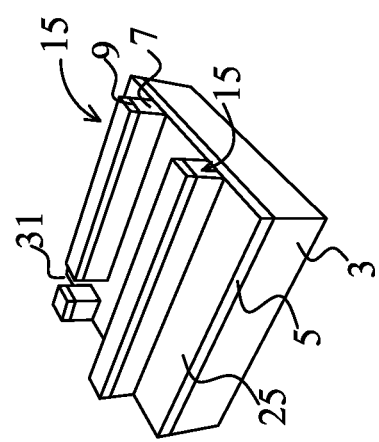

FIGS. 4A and 4B show sacrificial hardmask lines 15 disposed over surface 25 of hardmask layer 5. One of the illustrated sacrificial hardmask lines 15 includes void 31 therein. Alternatively stated, the sacrificial hardmask line 15 on the upper portion of FIG. 4B has been cut into two separate lines and separated by void 31. Width 29 of void 31 is on the order of 15-60 nm or smaller in various embodiments but include different dimensions in other embodiments.

Figure 5B:
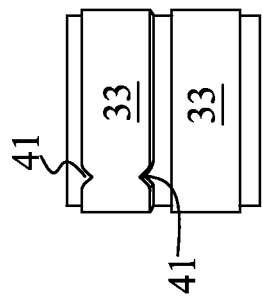
Figure 5A:
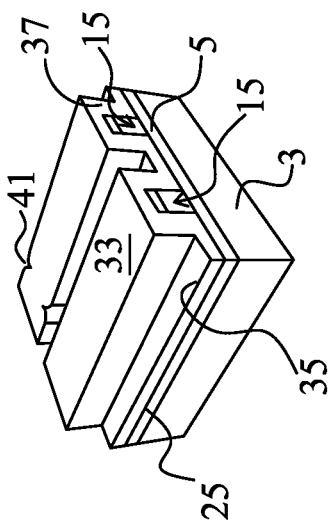

FIGS. 5A and 5B show spacer material 33 formed over the structure shown in FIGS. 4A, 4B. Spacer material 33 is formed of SiO, SiN, $SiO_xN_y$, TiO, TiN, Ta, TaN or AlO in various embodiments and is formed using ALD, CVD or other suitable deposition methods. Spacer material 33 is disposed on surface 25 of hardmask layer 5 and over sacrificial hardmask lines 15. Spacer material 33 is formed using conformal deposition techniques and therefore includes thinner portions 35 and thicker portions 37. Thinner portions 35 are disposed over surface 25 of hardmask layer 5 and also over the tops of sacrificial hardmask lines 15. Thicker portions 37 are disposed alongside sacrificial hardmask lines 15 and in voids 31. Notches 41 are formed at locations where spacer material 33 fills voids 31 that were shown in FIGS. 4A and 4B.

Figure 6B:
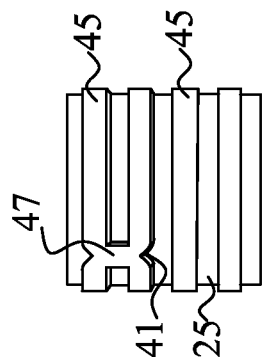
Figure 6A:
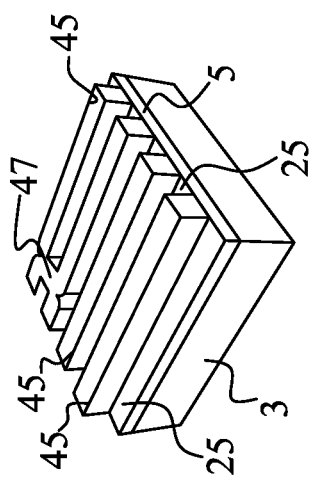

An anisotropic etching procedure is then carried out to substantially uniformly recede spacer material 33, i.e. remove a thickness of spacer material 33 such that spacer material 33 remains in the locations of thicker portions 37. The anisotropic etching procedure removes spacer material 33 from over sacrificial hardmask lines 15 and also exposes surface 25 of hardmask layer 5. After this anisotropic procedure is carried out to recede the thickness of spacer material 33, a spacer material pattern is formed with spacer material 33 disposed alongside hardmask lines 15 and filling void 31 that was shown in FIGS. 4A, 4B but not in other areas. A subsequent processing operation is then used to selectively remove sacrificial hardmask lines 15 to produce the structure shown in FIGS. 6A, 6B. FIGS. 6A, 6B show a pattern of spacer material including a plurality of spacer material features 45 disposed on surface 25 of hardmask layer 5. Bridge 47 is formed at the location previously occupied by void 31 and indicated by notches 41.

Figure 7A:
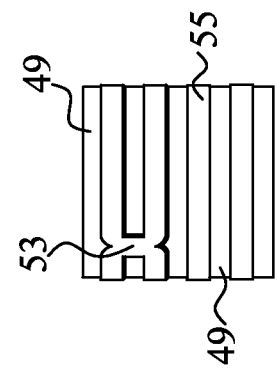
Figure 7B:
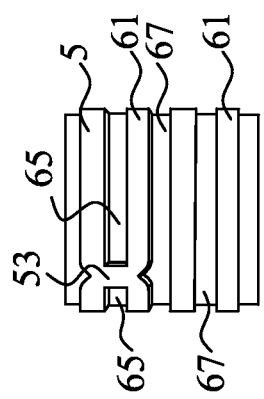

Spacer material features 45 and bridge 47 form a spacer material pattern and act as a mask during a subsequent etching operation that is carried out to etch uncovered portions of hardmask layer 5. Hardmask layer 5 is etched to clear thereby exposing upper surface 49 of base material 3. Various suitable etching techniques and operations may be used. In some embodiments, spacer material 33 is then selectively removed to produce the structure shown in FIGS. 7A and 7B in which surface 25 of hardmask layer 5 is exposed. The structures shown in FIGS. 7A and 7B include exposed upper surface 49 of base material 3 and a pattern formed of hardmask layer 5 including bridge 53. In the illustrated embodiment, the pattern of hardmask layer 5 includes lines 55 but other structures are formed in other embodiments.

Figure 8A:
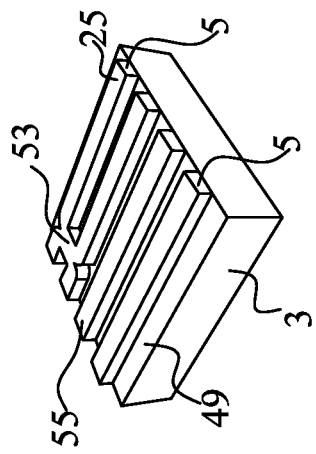
Figure 8B:
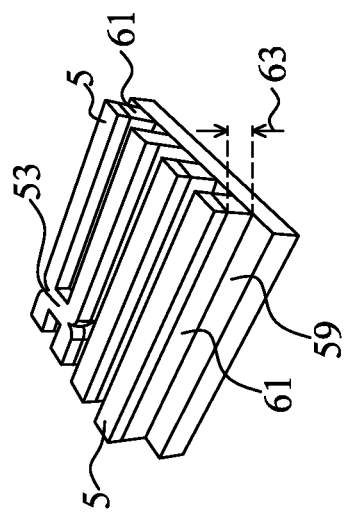

The pattern of hardmask layer 5 including lines 55 and bridge 53 is then used as a mask and an etching operation is carried out. In some embodiments the pattern of spacer material 33 still remains over hardmask layer 5 when the etching operation to etch base material 3, is carried out. The etching operation etches base material 3 and essentially translates the spacer material pattern to base material 3. FIGS. 8A and 8B show base material 3 being partially etched. In embodiments in which base material 3 is formed over a substrate, base material 3 may be etched to clear, i.e. openings are formed completely through base material 3. With base material 3 not completely etched through, base surface 59 is created. Depth 63 varies in various embodiments. Channels 65 and 67 are produced between raised sections 61. Bridge 53 now represents a spacing or gap between aligned channels 65 that are aligned end-to-end such as more clearly shown in FIG. 8B.

Hardmask layer 5 is then removed from the structures shown in FIGS. 8A and 8B resulting in patterned base material 3. In many embodiments, base material 3 is advantageously an insulating material. Channels 65 and 67 remain between raised sections 61 and may alternatively be referred to as trenches or grooves. A pattern of a new material which may be a conductive material, is then formed within channels 67 and 65.

In some embodiments, a further material is formed over base material 3, filling channels 67 and aligned channels 65. A planarization technique is then carried out to remove the further material from regions over raised sections 61, thereby leaving the further material in regions not occupied by raised sections 61, i.e. damascene patterning is carried out to remove the further material from over the tops of raised sections 61 and form leads of the further material in channels 67 and 65. In some embodiments, according to damascene principles a conductive material is formed over base material 3. A subsequent planarization technique is carried out to remove the conductive material from regions not occupied by raised sections 61, thereby forming a pattern of conductive features. In some embodiments, the planarization technique is chemical mechanical polishing ("CMP"), but other polishing or other planarization techniques are used in other embodiments.

Figure 9:
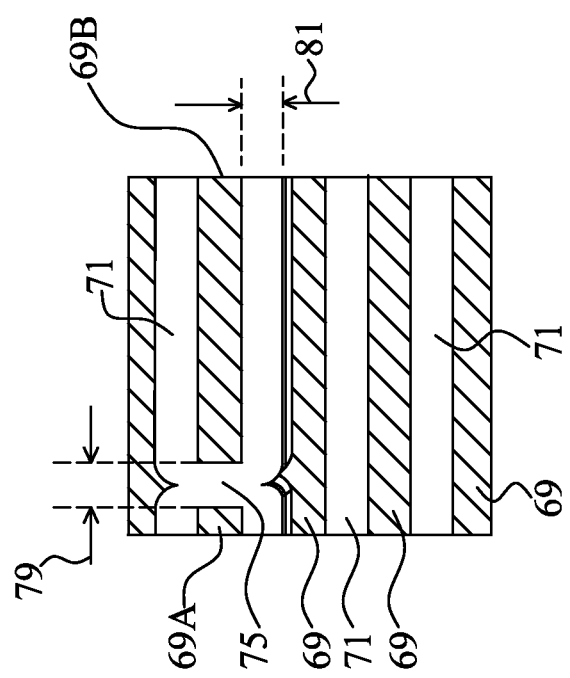
FIG. 9 is a top view showing a subsequent step in the processing operation sequence that follows the processing stage shown in FIGS. 8A, 8B.

FIG. 9 is a plan view showing the structure of FIGS. 8A and 8B after hardmask layer 5 has been removed and after damascene techniques are used to form a conductive material in channels 65 and 67 by forming the conductive material over the structure then planarizing to remove the conductive material from over insulating lines 71. Conductive lines 69 are disposed in areas not occupied by base material 3, i.e. conductive lines 69 fill former aligned channels 65 and channels 67. According to the embodiment in which base material 3 is an insulating layer, conductive lines 69 are disposed between insulating lines 71 formed of base material 3. Conductive lines 69A and 69B are linearly aligned end-to-end and longitudinally spaced apart by insulating gap 75. Insulating gap 75 includes a width 79 which is along the lines of 20-50 nm in some embodiments and successfully and completely isolates the conductive lines 69A and 69B from one another. Width 79 takes on other dimensions in other embodiments. Adjacent parallel conductive lines 69 are spaced apart by insulating line 71 which include a width 81 that ranges from 20-60 nm in some embodiments, but other widths are used in other embodiments. Conductive lines 69 include a width of about 20-60 nm in some embodiments but other widths are used in other embodiments. The substructure shown in FIG. 9 represents a small portion of a semiconductor device and conductive lines 69 and 69A and 69B couple and interconnect the various active devices and other interconnect features formed in other regions of a semiconductor device chip. Subsequent processing operations are then carried out to complete the manufacture of the integrated circuit or other semiconductor device, including the structure described in the disclosure.

A method for forming semiconductor devices using damascene techniques provides self-aligned conductive lines that have an end-to-end spacing less than 60 nm without shorting. The method includes using at least one sacrificial hardmask layer to produce a mandrel and forming a void in the mandrel. The sacrificial hardmask layers are formed over a base material which is advantageously an insulating material. Another hardmask layer is also disposed over the base material in some embodiments. A spacer material is formed alongside the mandrel and filling the void. The spacer material serves as a mask and at least one etching procedure is carried out to translate the pattern of the spacer material into the base material. The patterned base material includes trenches and raised portions. Materials are removed from over the base material and conductive features are formed in the trenches using damascene techniques.

According to one aspect, a method for forming a semiconductor device is provided. The method comprises: providing a substrate with a material layer thereover and a hardmask layer over the material layer; patterning the hardmask layer thereby forming at least one hardmask line; forming a void in the hardmask line; forming spacer material over the substrate, including over the hardmask line, and filling the void; anisotropically etching portions of the spacer material to form a spacer pattern that includes the spacer material disposed along sides of the hardmask line and filling the void, but not over the hardmask line. The method further comprises etching the material layer in areas not covered by the spacer pattern thereby forming a material layer pattern that includes trenches.

According to another aspect, a method for forming a semiconductor device is provided. The method comprises: providing a substrate with an insulating layer thereover; forming a plurality of sacrificial hardmask layers over the insulating layer; patterning the plurality of sacrificial hardmask layers thereby forming at least one sacrificial hardmask line; forming a void in the sacrificial hardmask line; and forming a material pattern including material alongside the sacrificial hardmask line and filling the void. The method also comprises removing the sacrificial hardmask line; using the material pattern as a mask and etching trenches into the insulating material; removing the material, thereby producing a pattern in the insulating material including the trenches and raised portions; and filling the trenches with conductive material According to yet another aspect, a method for forming a semiconductor device is provided. The method comprises: providing a substrate with a first material layer thereover and a second material layer over the first material layer; forming at least one sacrificial hardmask layer over the second material layer; patterning the at least one sacrificial hardmask layer thereby forming at least one sacrificial hardmask line; forming a void in the at least one sacrificial hardmask line; forming spacer material over the substrate, including over the sacrificial hardmask line, and filling the void; removing portions of the spacer material to form a spacer pattern that includes the spacer material disposed along sides of the at least one sacrificial hardmask line and filling the void but not over the at least one sacrificial hardmask line; removing the at least one sacrificial hardmask line; and etching to transfer the spacer pattern into the first layer thereby forming a first material layer pattern.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method for forming a semiconductor device, the method comprising:
   providing a substrate with a material layer thereover and a hardmask layer over the material layer;
   patterning the hardmask layer thereby forming at least one hardmask line;
   forming a void in the hardmask line;

forming spacer material over the substrate, including over the hardmask line, and filling the void;

anisotropically etching portions of the spacer material to form a spacer pattern that includes the spacer material disposed along sides of the hardmask line and filling the void but not over the hardmask line; and etching the material layer in areas not covered by the spacer pattern thereby forming a material layer pattern that includes trenches.

2. The method as in claim 1, further comprising removing the hardmask line prior to the etching.

3. The method as in claim 2, wherein the material layer is an insulating material and further comprising forming a conductive material over the material layer and filling the trenches after the etching, then planarizing to remove portions of the conductive material from over the material layer thereby exposing an upper surface of the material layer and forming a pattern of the conductive material in the trenches.

4. The method as in claim 1, wherein the material layer is an insulating material and further comprising forming a conductive material over the material layer after the etching, then planarizing to remove portions of the conductive material to expose an upper surface of the material layer and form a pattern of the conductive material in the trenches.

5. The method as in claim 4, wherein the pattern of conductive material includes linearly aligned conductive leads longitudinally spaced apart by a distance of 60 nm or less, by a segment of the material layer.

6. The method as in claim 1, wherein the substrate further includes a further hardmask layer between the material layer and the hardmask layer and wherein the patterning the hardmask layer further comprises patterning the further hardmask layer such that the hardmask line includes the hardmask layer and the further hardmask layer.

7. The method as in claim 6, wherein the hardmask layer comprises one of SiN, SiON and a silicon-containing antireflective coating (ARC) and wherein the further hardmask comprises one of spin-on carbon and amorphous carbon.

8. The method as in claim 1, wherein the substrate includes a further hardmask disposed between the material layer and the hardmask and further comprising etching the further hardmask in the areas not covered by the spacer pattern then removing the spacer material, prior to the etching the material layer.

9. The method as in claim 8, further comprising removing the hardmask line prior to the etching the further hardmask.

10. The method as in claim 9, wherein the material layer is an insulating material and further comprising, after the etching the material layer, removing the further hardmask and forming a conductive material in the trenches.

11. The method as in claim 1, wherein the forming a void includes coating with photoresist, patterning the photoresist, and etching to form the void.

12. The method as in claim 1, wherein the patterning the hardmask layer includes forming a photoresist pattern and etching, the at least one hardmask line comprises a plurality of the hardmasks lines, the material layer pattern includes a plurality of the trenches further comprising filling the trenches with conductive material.

13. A method for forming a semiconductor device, the method comprising:

providing a substrate with an insulating layer thereover;

forming a plurality of sacrificial hardmask layers over the insulating layer;

patterning the plurality of sacrificial hardmask layers thereby forming a sacrificial hardmask line;

forming a void in the sacrificial hardmask line;

forming a material pattern including material alongside the sacrificial hardmask line and filling the void;

removing the sacrificial hardmask line;

using the material pattern as a mask and etching trenches into the insulating material;

removing the material, thereby producing a pattern in the insulating material including the trenches and raised portions; and filling the trenches with conductive material.

14. The method as in claim 13, wherein the forming material alongside the sacrificial hardmask line comprises forming the material over the substrate including over the sacrificial hardmask lines, then carrying out an anisotropic etch that recedes a thickness of the material, thereby forming the material pattern.

15. The method as in claim 13, wherein the filling the trenches with conductive material comprises depositing the conductive material over the raised portions and filling the trenches, then polishing to planarize.

16. The method as in claim 13, wherein the substrate further includes a hardmask layer disposed over the insulating material, wherein the plurality of sacrificial hardmask layers is formed over the hardmask layer, further comprising etching the hardmask layer using the material pattern as a mask prior to the etching, and further comprising removing the hardmask layer after the removing the material.

17. A method for forming a semiconductor device, the method comprising:

providing a substrate with a first material layer thereover and a second material layer over the first material layer;

forming at least one sacrificial hardmask layer over the second material layer;

patterning the at least one sacrificial hardmask layer thereby forming at least one sacrificial hardmask line;

forming a void in the at least one sacrificial hardmask line;

forming spacer material over the substrate, including over the sacrificial hardmask line, and filling the void;

removing portions of the spacer material to form a spacer pattern that includes the spacer material disposed along sides of the at least one sacrificial hardmask line and filling the void but not over the at least one sacrificial hardmask line;

removing the at least one sacrificial hardmask line; and etching to transfer the spacer pattern into the first layer thereby forming a first material layer pattern.

18. The method as in claim 17, wherein the first material layer comprises an insulating material and the second material layer comprises a hardmask layer.

19. The method as in claim 17, wherein the etching comprises first etching the second material layer then etching the first material layer, the first material layer pattern includes trenches and further comprising removing the spacer pattern and removing the second material layer after the etching and forming a conductive material in the trenches.

20. The method as in claim 19, wherein the forming a conductive material in the trenches comprises forming a conductive material over raised portions of the first material layer pattern and filling the trenches then removing the conductive layer from the raised portions of the first material layer pattern.

* * * * *